(12) United States Patent
Asanuma

(10) Patent No.: US 10,384,269 B2
(45) Date of Patent: Aug. 20, 2019

(54) SURFACE-COATED CUTTING TOOL

(71) Applicant: MITSUBISHI MATERIALS CORPORATION, Tokyo (JP)

(72) Inventor: Hidetoshi Asanuma, Tokyo (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 190 days.

(21) Appl. No.: 15/521,919

(22) PCT Filed: Nov. 12, 2015

(86) PCT No.: PCT/JP2015/081832
§ 371 (c)(1),
(2) Date: Apr. 26, 2017

(87) PCT Pub. No.: WO2016/076386
PCT Pub. Date: May 19, 2016

(65) Prior Publication Data
US 2017/0312830 A1    Nov. 2, 2017

(30) Foreign Application Priority Data
Nov. 13, 2014 (JP) ................................. 2014-230307

(51) Int. Cl.
*B23B 27/14* (2006.01)
*B23B 51/00* (2006.01)
(Continued)

(52) U.S. Cl.
CPC ............ *B23B 27/148* (2013.01); *B23B 27/14* (2013.01); *B23B 51/00* (2013.01); *B23C 5/16* (2013.01);
(Continued)

(58) Field of Classification Search
USPC .......... 51/307, 309; 428/216, 336, 697, 698, 428/699
See application file for complete search history.

(56) References Cited

U.S. PATENT DOCUMENTS 8,025,958 B2 * 9/2011 Yamamoto .............. C23C 14/06
428/216
2002/0051887 A1   5/2002 Jonsson et al.
(Continued)

FOREIGN PATENT DOCUMENTS

EP          1470879 A1   10/2004
JP         07-097679 A    4/1995
(Continued)

OTHER PUBLICATIONS

European Search Report dated May 28, 2018, issued for the corresponding EP15858400.3.
International Search Report dated Jan. 26, 2016, issued for PCT/JP2015/081832.

*Primary Examiner* — Archene A Turner
(74) *Attorney, Agent, or Firm* — Locke Lord LLP

(57) ABSTRACT

In a surface-coated cutting tool in which a hard coating layer having a total layer thickness of 0.5 to 10 μm is deposited on a surface of a tool body made of WC-based cemented carbide or TiCN-based cermet, the hard coating layer has an alternately laminated structure of A layers and B layers, in a case where the A layer is: $(Al_aTi_{1-a})N$ (here, a is in atomic ratio), the A layer satisfies $0.50 \leq a < 0.75$, in a case where the B layer is: $(Al_bTi_{1-b})N$ (here, b is in atomic ratio), the B layer satisfies $0.75 \leq b \leq 0.95$, and when a layer thickness per layer of the A layers is represented by x (nm) and a layer thickness per layer of the B layers is represented by y (nm), $5y \geq x \geq 3y$ and 250 (nm)$\geq x+y \geq 100$ (nm) are satisfied.

1 Claim, 2 Drawing Sheets

(51) Int. Cl.
  *B23C 5/16*   (2006.01)
  *C23C 14/06*  (2006.01)
  *C23C 14/32*  (2006.01)
  *C23C 28/00*  (2006.01)
  *C23C 30/00*  (2006.01)

(52) U.S. Cl.
  CPC ...... *C23C 14/0635* (2013.01); *C23C 14/0641* (2013.01); *C23C 14/0688* (2013.01); *C23C 14/325* (2013.01); *C23C 28/42* (2013.01); *C23C 28/44* (2013.01); *C23C 30/005* (2013.01); *B23B 2222/16* (2013.01); *B23B 2222/28* (2013.01); *B23B 2228/105* (2013.01); *B23B 2228/36* (2013.01); *B23C 2222/16* (2013.01); *B23C 2222/28* (2013.01); *B23C 2228/10* (2013.01)

(56) References Cited

U.S. PATENT DOCUMENTS

| | | |
|---|---|---|
| 2005/0129986 A1 | 6/2005 | Sata et al. |
| 2007/0141346 A1 | 6/2007 | Nordlof et al. |

FOREIGN PATENT DOCUMENTS

| | | | |
|---|---|---|---|
| JP | 11-061380 A | | 3/1999 |
| JP | 2002-254229 A | | 9/2002 |
| JP | 2003-508242 A | | 3/2003 |
| JP | 2003-205405 A | | 7/2003 |
| JP | 2003-211304 A | | 7/2003 |
| JP | 2003-326402 A | | 11/2003 |
| JP | 2003-334704 | * | 11/2003 |
| JP | 2003-334704 A | | 11/2003 |
| JP | 2007-196365 A | | 8/2007 |
| WO | 2013/002385 | * | 1/2013 |
| WO | 2014/019897 A1 | | 2/2014 |

* cited by examiner

[Fig. 1]
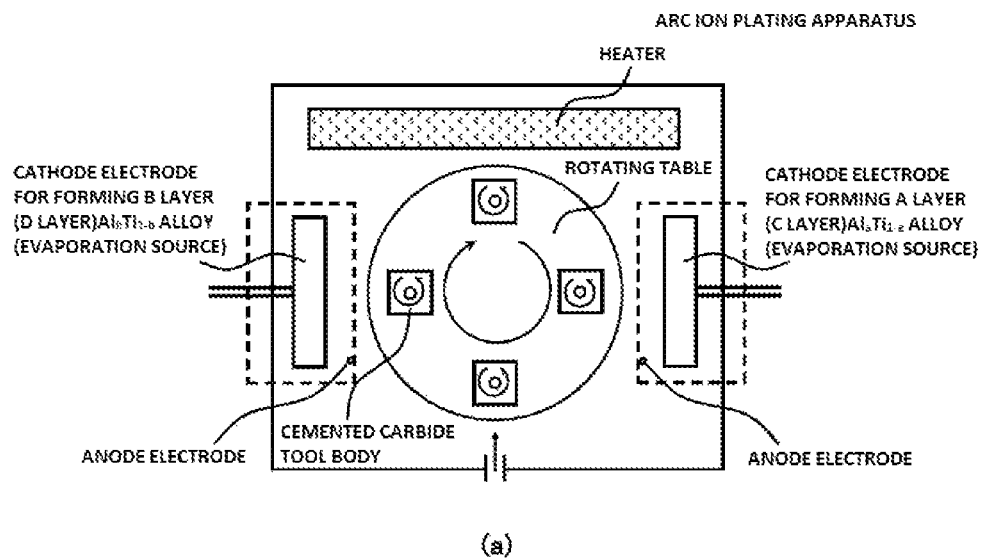
(a)
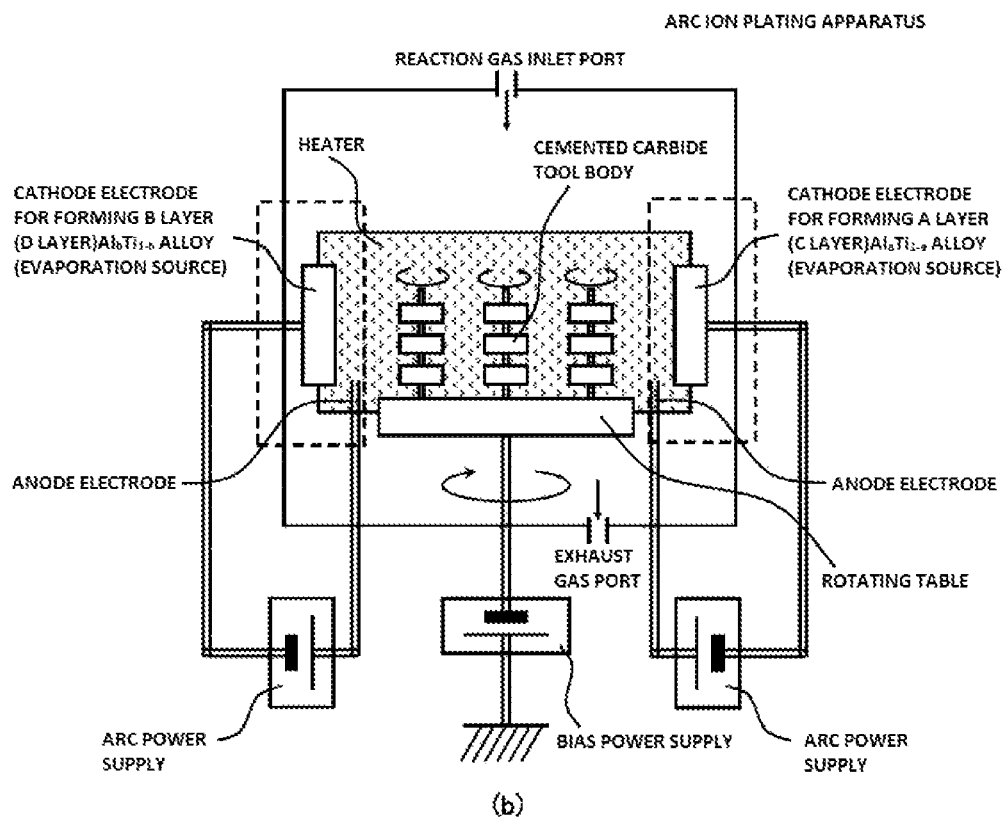
(b)

[Fig. 2]
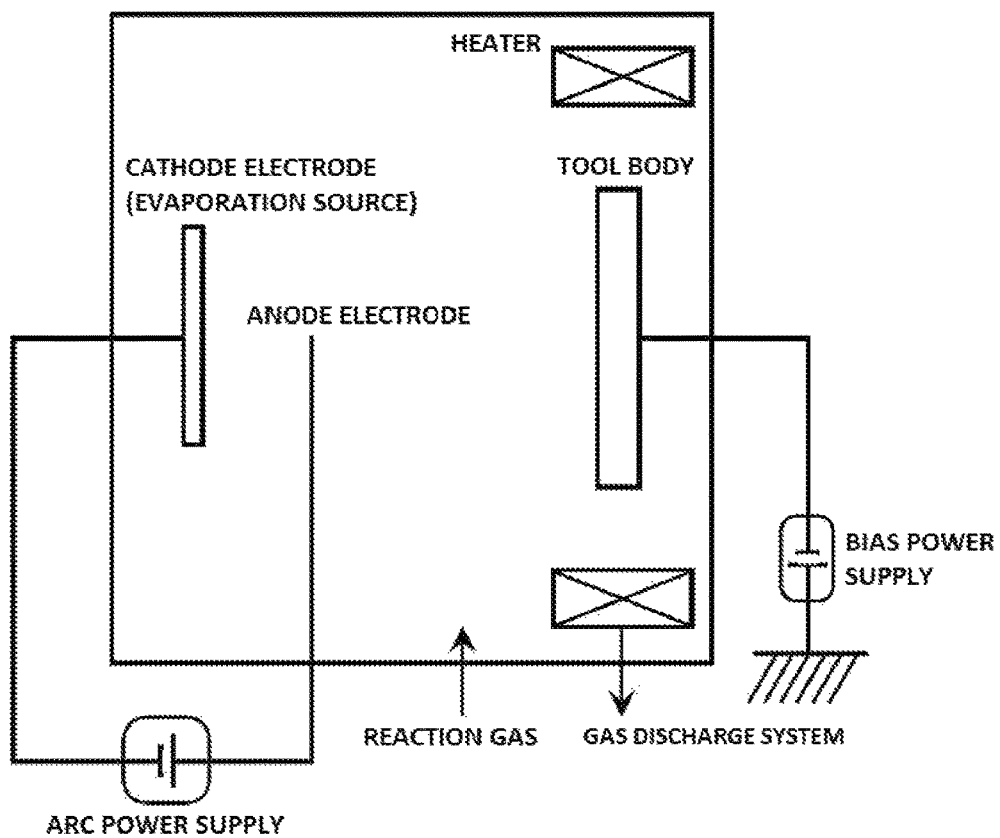

SURFACE-COATED CUTTING TOOL

TECHNICAL FIELD

The present invention relates to a surface-coated cutting tool (hereinafter, referred to as coated tool), and more particularly to a coated tool in which a hard coating layer exhibits excellent wear resistance during high-speed cutting work, for example, of carbon steel, alloy steel, or high hardness steel during which high-temperature heat is generated.

BACKGROUND ART

In general, as coated tools, there are inserts which are detachably attached to the tip end portion of an insert holder to be used for turning or planing a work material such as various types of steels and high hardness steels, drills or miniature drills used for drilling or the like of a work material, and solid type end mills used for facing, grooving, shoulder milling, and the like of a work material. In addition, insert type end mill tools and the like are known which include an insert detachably attached thereto and perform cutting in the same manner as the solid type end mills.

In addition, from the viewpoint of excellent wear resistance, a coated tool in which the surface of a tool body made of tungsten carbide-based cemented carbide, titanium carbonitride-based cermet, or the like is coated with a complex nitride of Al and Ti (hereinafter, referred to as (Al,Ti)N) as a hard coating layer, through an arc ion plating method, which is a type of a physical vapor deposition method, is hitherto known.

For example, PTL 1 proposes a cutting tool in which by alternately laminating two types of compounds (A and B) made of $Ti_xAl_{1-x}N$ and $Ti_yAl_{1-y}N$ ($0 \leq x < 0.5$, and $0.5 < y \leq 1$) repetitively on the surface of a body with a repetitive lamination period λ of 0.5 nm to 20 nm, an aluminum-rich ultra-thin film laminate coating having a total film thickness of 0.5 μm to 10 μm is formed, so that both high hardness and oxidation resistance are realized and an increase in the wear life of the tool is achieved.

In addition, PTL 2 proposes improving wear resistance through physical vapor deposition of, on the surface of a cutting tool body, via a crystal hysteresis layer which has an average layer thickness of 0.05 to 1 μm and is made of an Al and Ti complex nitride layer satisfying the composition formula: $(Al_{1-x}Ti_x)N$ (here, x is 0.40 to 0.65 in terms of atomic ratio) and having a cubic crystal structure, an oxidation-resistant coating layer which has an average layer thickness of 2 to 15 μm and is made of an Al-based complex nitride layer satisfying the composition formula: $(Al_{1-y}Ti_y)N$ (here, y is 0.05 to 0.25 in terms of atomic ratio) and having the same cubic crystal structure.

Furthermore, PTL 3 proposes a coated tool in which the surface of a tool body is coated with a hard coating layer made of an (Al,Ti)N layer, the wear resistance of the hard coating layer is improved by forming the (Al,Ti)N layer into a total average layer thickness of 1 to 15 μm, which has a component concentration distribution structure in which an Al highest content point (Ti lowest content point) and an Al lowest content point (Ti highest content point) are alternately present repetitively with predetermined intervals therebetween along the thickness direction, and the content of Al (Ti) continuously changes from the Al highest content point to the Al lowest content point and from the Al lowest content point to the Al highest content point, the Al highest content point and the Al lowest content point respectively satisfy the composition formula: $(Al_xTi_{1-x})N$ (here, x is 0.70 to 0.95 in terms of atomic ratio) and the composition formula: $(Al_yTi_{1-y})N$ (here, y is 0.40 to 0.65 in atomic ratio), and the interval between the Al highest content point and the Al lowest content point adjacent to each other is 0.01 to 0.1 μm.

Moreover, it is also known that in the coated tool of the related art described above, for example, the tool body is loaded into an arc ion plating apparatus, which is a type of a physical vapor deposition apparatus illustrated in the schematic explanatory view of FIG. 2, an arc discharge is generated between an anode electrode and a cathode electrode (evaporation source) in which an Al—Ti alloy having a predetermined composition is set under a current condition of 90 to 100 A in a state in which the tool body is heated to a temperature of 450° C. to 500° C. by a heater, nitrogen gas is simultaneously introduced into the apparatus as a reaction gas to form a nitrogen atmosphere, and the evaporated particles are deposited on the surface of the tool body under the condition that a bias voltage of, for example, −100 to −200V is applied to the tool body, so that a hard coating layer, made of a (Al,Ti)N layer, is formed.

CITATION LIST

Patent Literature

[PTL 1] JP-A-7-97679
[PTL 2] JP-A-2003-205405
[PTL 3] JP-A-2003-326402

SUMMARY OF INVENTION

Technical Problem

The automation of cutting apparatuses in recent years has been remarkable, and there has been a strong demand for power saving and energy saving during the cutting work and a further reduction in cost. In accordance with this, there has been a trend toward a further increase in speed during cutting work. Although there have been no particular problems in a case where the coated tool in the related art described above is used under typical cutting work conditions of carbon steel, alloy steel, and the like, particularly in a case, where the coated tool is used under high-speed cutting work conditions accompanied by the generation of high-temperature heat, wear progresses extremely quickly due to insufficient heat resistance and insufficient hardness of the hard coating layer. Therefore, in the current situation, the coated tool reaches the end of its service life within a relatively short time.

Solution to Problem

Therefore, from the above-described viewpoints, the inventors have intensively studied to develop a coated tool in which a hard coating layer exhibits excellent wear resistance during high-speed cutting work of carbon steel, alloy steel, high hardness steel, and the like during which high-temperature heat is generated. As a result, the following knowledge has been obtained.

Al, which is a constituent component of a (Al,Ti)N layer, enhances high temperature hardness and heat resistance, Ti enhances high temperature strength. As a result, the (Al,Ti)N layer has excellent high temperature hardness and high temperature strength. However, when the (Al,Ti)N layer is expressed by $(Al_bT)N$, the composition formula:

if the value of b (here, atomic ratio) representing the Al content ratio is 0.75 or higher, (Al,Ti)N crystal grains having a hexagonal structure are formed, and thus the hardness of the entire (Al,Ti)N layer decreases, resulting in a reduction in the wear resistance.

Therefore, the inventors found that instead of forming the (Al,Ti)N layer (hereinafter, sometimes referred to as "B layer") in which the value of b (here, atomic ratio) representing the Al content ratio is 0.75 or higher as a single layer, an alternately laminated structure is formed with an (Al,Ti)N layer (hereinafter, sometimes referred to as "A layer") having a cubic structure having a lower Al content ratio than the B layer, and the layer thicknesses of the A layer and the B layer were controlled to be in appropriate ranges, respectively, thereby allowing the crystal structure of the B layer to be maintained in the cubic structure rather than the hexagonal structure.

That is, it was found that even in a case where the Al content ratio is increased, the entire (Al,Ti)N layer can be maintained in the cubic structure. Therefore, a hard coating layer obtained therefrom can have high hardness and excellent heat resistance. A coated tool in which the surface of a tool body is coated with the hard coating layer can exhibit excellent wear resistance during high-speed cutting work of carbon steel, alloy steel, high hardness steel, or the like during which high-temperature heat is generated.

The present invention is made based on the above-described knowledge.

"(1) A surface-coated cutting tool in which a hard coating layer having a total layer thickness of 0.5 to 10 μm is deposited on a surface of a tool body made of tungsten carbide-based cemented carbide or titanium carbonitride-based cermet, in which (a) the hard coating layer has an alternately laminated structure of A layers and B layers, (b) in a case where the A layer is expressed by a composition formula: $(Al_aTi_{1-a})N$ (here, a is in atomic ratio), the A layer satisfies $0.5 \leq a < 0.75$, (c) in a case where the B layer is expressed by a composition formula: $(Al_bTi_{1-b})N$ (here, b is in atomic ratio), the B layer satisfies $0.75 \leq b \leq 0.95$, and (d) when a layer thickness per layer of the A layers is represented by x (nm) and a layer thickness per layer of the B layers is represented by y (nm), $5y \geq x \geq 3y$ and $250$ (nm)$\geq x+y \geq 100$ (nm) are satisfied."

Next, the hard coating layer of the coated tool of the present invention will be described in more detail.

Composition of Hard Coating Layer:

In a case where the (Al,Ti)N layer forming the A layer of the hard coating layer is expressed by the composition formula: $(Al_aTi_{1-a})N$ (here, a is in atomic ratio), when the value of a representing the Al content ratio is less than 0.50, the ratio of Ti is relatively high and thus excellent high temperature strength is obtained. However, sufficient hardness cannot be ensured. On the other hand, when the value of a is 0.75 or higher, with a tendency of a reduction in high temperature strength, (Al,Ti)N crystal grains having a hexagonal structure are formed. Therefore, the high temperature hardness decreases, and excellent wear resistance cannot be exhibited.

Therefore, in the present invention, the value of a in $(Al_aTi_{1-a})N$ forming the A layer was determined as $0.50 \leq a < 0.75$.

In a case where the B layer forming the alternately laminated structure of the hard coating layer with the A layer is expressed by a composition formula: $(Al_bTi_{1-b})N$ (here, b is in atomic ratio), the B layer needs to satisfy $0.75 \leq b \leq 0.95$.

By causing the value of b in the B layer to be 0.75 or higher, the hard coating layer has a high Al content and thus the heat resistance thereof can be improved. However, when the value of b exceeds 0.95, the high temperature strength decreases with a relative reduction in the Ti content, and the amount of (Al,Ti)N crystal grains having a hexagonal structure in the layer increases. Therefore, the hardness decreases, and there is a tendency of a reduction in wear resistance.

Therefore, in the present invention, the value of b in $(Al_bTi_{1-b})N$ forming the B layer was determined as $0.75 \leq b \leq 0.95$.

It should be noted that in a case where the layer having the same composition as that of the B layer (that is, the content ratio of Al is 0.75 or higher and 0.95 or lower) is not an alternately laminated structure with the A layer, but forms a hard coating layer for itself, most of the (Al,Ti)N crystal grains become crystal grains having a hexagonal structure, so that the hardness of the hard coating layer is significantly lowered and the wear resistance cannot be exhibited.

However, in the present invention, since the A layers and the B layers form an alternately laminated structure while the layer thicknesses thereof are determined to be in appropriate ranges, respectively, even in a case where the content ratio of Al in the B layer is increased to 0.75 or higher and 0.95 or lower, the B layer can be formed to have a cubic structure rather than a hexagonal structure.

Hard Coating Layer Having Alternately Laminated Structure of A Layers and B Layers:

In a case where the average layer thickness per layer of the A layers formed in the alternately laminated structure is represented by x (nm) and the average layer thickness per layer of the B layers formed in the alternately laminated structure is represented by y (nm), it is determined to satisfy $5y \geq x \geq 3y$.

When x is lower than 3y, the proportion of the B layer having a high Al content ratio in the hard coating layer increases, and crystal grains having a hexagonal crystal structure with low hardness are likely to be formed. Therefore, the hardness of the hard coating layer decreases. On the other hand, when x is higher than 5y, the proportion of the B layer having a high Al content ratio decreases, and sufficient heat resistance cannot be exhibited.

Therefore, in the present invention, the relationship between the average layer thickness x per layer of the A layers and the average layer thickness y per layer of the B layers is determined to satisfy $5y \geq x \geq 3y$.

Furthermore, in order to cause the hard coating layer having the alternately laminated structure to have a higher hardness, the unit thickness x+y (that is, the total layer thickness of a case where one layer of the A layers and one layer of the B layers are set to a unit) of the A layers and the B layers is set to be 100 (nm) or greater and 250 (nm) or smaller.

In a case where the unit thickness is smaller than 100 (nm), the average layer thickness y of one layer of the B layers becomes relatively small, and the effect of improving the heat resistance of the hard coating layer decreases. On the other hand, when the unit thickness exceeds 250 (nm), crystal grains having a hexagonal structure are likely to be formed in the B layers, resulting in a reduction in the hardness of the hard coating layer.

Therefore, the unit thickness x+y of the A layers and the B layers is determined to satisfy $250$ (nm)$\geq x+y \geq 100$ (nm).

Total Layer Thickness of Hard Coating Layer:

When the total layer thickness of the hard coating layer having the alternately laminated structure is smaller than 0.5

μm, sufficient wear resistance cannot be exhibited for a long-term use. On the other hand, when the total layer thickness exceeds 10 μm, abnormal damage such as chipping, fracturing, and peeling easily occurs during cutting work. Therefore, the total layer thickness of the hard coating layer is determined to be 0.5 to 10 μm.

Advantageous Effects of Invention

According to the coated tool of the present invention, the hard coating layer formed on the surface of the tool body is formed in the alternately laminated structure of the A layers expressed by the composition formula $(Al_aTi_{1-a})N$ (here, a is in atomic ratio and satisfies $0.50 \leq a < 0.75$) and the B layers expressed by the composition formula: $(Al_bTi_{1-b})N$ (here, b is in atomic ratio, and satisfies $0.75 \leq b \leq 0.95$). Furthermore, since the layer thickness x (nm) per layer of the A layers and the layer thickness y (nm) per layer of the B layers satisfies the relationships of $5y \geq x \geq 3y$ and $250 \text{ (nm)} \geq x+y \geq 100 \text{ (nm)}$, the hard coating layer has excellent heat resistance and high hardness. As a result, even during high-speed cutting work of carbon steel, alloy steel, high hardness steel, and the like during which high-temperature heat is generated, abnormal damage such as chipping, fracturing, and peeling does not occur, and excellent wear resistance can be exhibited for a long-term use.

BRIEF DESCRIPTION OF DRAWINGS

FIG. 1 illustrates an arc ion plating apparatus used to form hard coating layers to be formed in a coated tool of the present invention and a comparative coated tool, in which FIG. 1(a) is a schematic plan view, and FIG. 1(b) is a schematic front view.

FIG. 2 is a schematic explanatory view of an existing arc ion plating apparatus used to describe the related art.

DESCRIPTION OF EMBODIMENTS

Next, examples of a coated tool of the present invention will be described in detail.

Although a coated tool having a tool body made of tungsten carbide (WC)-based cemented carbide is described herein, this can also be applied to a case where the tool body is made of titanium carbonitride (TiCN)-based cermet.

Example 1

As raw material powders, a WC powder, a VC powder, a $Cr_3C_2$ powder, and a Co powder each having an average grain size of 1 μm to 3 μm were prepared, and the raw material powders were mixed in mixing compositions shown in Table 1, were wet-mixed by a ball mill for 72 hours, and were dried. Thereafter, the resultant was press-formed into a compact at a pressure of 100 MPa, and the compact was sintered in a vacuum at 6 Pa under a condition in which the compact was maintained at a temperature of 1400° C. for one hour. After sintering, tool bodies A-1 to A-3 made of WC-based cemented carbide with an insert shape according to ISO standard CNMG 120408 were produced.

In addition, as raw material powders, a TiCN (TiC/TiN=50/50 in terms of weight ratio) powder, an $Mo_2C$ powder, a ZrC powder, an NbC powder, a TaC powder, a WC powder, a Co powder, and an Ni powder, each having an average grain size of 0.5 to 2 μm, were prepared, and the raw material powders were mixed in mixing compositions shown in Table 2, were wet-mixed by a ball mill for 24 hours, and were dried. Thereafter, the resultant was press-formed into a compact at a pressure of 100 MPa, and the compact was sintered in a nitrogen atmosphere at 2 kPa under a condition in which the compact was held at a temperature of 1500° C. for one hour. After sintering, tool bodies B-1 to B-3 made of TiCN-based cermet with an insert shape according to ISO standard CNMG 120408 were produced by honing with R: 0.03 mm on a cutting edge portion.

(a) Subsequently, each of the tool bodies A-1 to A-3 and B-1 to B-3 was subjected to ultrasonic cleaning in acetone and was dried. In this state, the tool bodies A-1 to A-3 and B-1 to B-3 were mounted along the outer circumferential portions on a rotating table in an arc ion plating apparatus illustrated in FIG. 1 at positions distant from the center axis by predetermined distances in a radial direction thereof. In addition, cathode electrodes (evaporation sources) made of an Al—Ti alloy for forming the A layers and an Al—Ti alloy for forming the B layers were disposed at positions opposing each other with the rotating table interposed therebetween.

(b) First, while the inside of the apparatus was evacuated and held in a vacuum at 0.1 Pa or lower, the inside of the apparatus was heated to 600° C. by a heater. Thereafter, a DC bias voltage of −1000 V was applied to the tool bodies that were being rotated while revolving on the rotating table. In addition, arc discharge was generated by allowing a current of 100 A to flow between the Al—Ti alloys (cathode electrodes) and anode electrodes such that the surfaces of the tool bodies were subjected to bombardment cleaning.

(c) Next, the atmosphere in the apparatus was held in a nitrogen atmosphere at 0.5 to 9.0 Pa, a DC bias voltage of −20 to −150 V was applied to the tool bodies that were being rotated while revolving on the rotating table, arc discharge was generated by allowing a current of 50 to 250 A to flow between the Al—Ti alloy electrode for forming the A layer as the cathode electrode (evaporation source) and the anode electrode, to form an A layer having a predetermined layer thickness. Next, arc discharge was generated by allowing a current of 50 to 250 A to flow between the Al—Ti alloy electrode for forming the B layer and the anode electrode to form a B layer having a predetermined layer thickness. These operations were alternately performed repetitively to deposit the hard coating layer having the alternately laminated structure of the A layers and the B layers having target compositions and target layer thicknesses shown in Table 3.

Accordingly, surface-coated inserts (hereinafter, referred to as present invention coated inserts) 1 to 10 as the coated tools of the present invention were produced.

In addition, for the purpose of comparison, (a) Each of the tool bodies A-1 to A-3 and B-1 to B-3 was subjected to ultrasonic cleaning in acetone and was dried. In this state, the tool bodies A-1 to A-3 and B-1 to B-3 were mounted along the outer circumferential portions on the rotating table in the arc ion plating apparatus illustrated in FIG. 1 at positions distant from the center axis by predetermined distances in the radial direction thereof. In addition, Al—Ti alloys (hereinafter, each referred to as an Al—Ti alloy for forming a C layer and an Al—Ti alloy for forming a D layer) having different compositions were disposed as cathode electrodes at positions opposing each other with the rotating table interposed therebetween.

(b) First, while the inside of the apparatus was evacuated and held in a vacuum at 0.1 Pa or lower, the inside of the apparatus was heated to 600° C. by a heater. Thereafter, a DC bias voltage of −1000 V was applied to the tool bodies that were being rotated while revolving on the rotating table. In addition, arc discharge was generated by allowing a current of 100 A to flow between the Al—Ti alloys (cathode electrodes) and anode electrodes such that the surfaces of the tool bodies were subjected to bombardment cleaning.

(c) Next, the atmosphere in the apparatus was held in a nitrogen atmosphere at 0.5 to 9.0 Pa, a DC bias voltage of −20 to −150 V was applied to the tool bodies that were being rotated while revolving on the rotating table, arc discharge was generated by allowing a current of 50 to 250 A to flow between the Al—Ti alloy electrode for forming a C layer as the cathode electrode (evaporation source) and the anode electrode to deposit a C layer having a predetermined composition. Next, arc discharge was generated by allowing a current of 50 to 250 A to flow between the Al—Ti alloy electrode for forming a D layer and the anode electrode to deposit a D layer having a predetermined composition, whereby hard coating layers having alternately laminated layers with target compositions and target layer thicknesses shown in Table 4 are deposited.

Accordingly, surface-coated inserts (hereinafter, referred to as comparative coated inserts) 1 to 5 as comparative coated tools were produced.

Next, regarding the present invention coated inserts 1 to 10 and the comparative coated inserts 1 to 5, the composition of each of the layers exhibiting the alternately laminated structures of the hard coating layers was measured by performing energy-dispersive X-ray spectroscopy on the longitudinal section of the hard coating layers using a transmission electron microscope, and all of the results showed substantially the same compositions as the target compositions.

In addition, the average layer thickness of each of the layers exhibiting the alternately laminated structures of the hard coating layers was measured in a section using the transmission electron microscope, and all of the results showed substantially the same average values (average value of 5 points) as the target layer thicknesses.

The measurement values are shown in Tables 3 and 4.

Next, a cutting test was conducted on the present invention coated inserts 1 to 10 and the comparative coated inserts 1 to 5 under the following cutting conditions, and the flank wear width of a cutting edge was measured in each high-speed cutting work test.

Cutting Condition A:
Work material: a round bar according to JIS SCM440 (HB 330)
Cutting speed: 220 m/min
Depth of cut: 0.2 mm
Feed: 0.28 mm/rev
Cutting time: 5 minutes A high-speed cutting work test of alloy steel (typical cutting speed and feed were respectively 165 m/min. and 0.25 mm/rev.) under the above conditions.

Cutting condition B:
Work material: a round bar according to JIS S45C (HB 250)
Cutting speed: 200 m/min
Depth of cut: 0.2 mm
Feed: 0.33 mm/rev
Cutting time: 5 minutes A high-speed cutting work test of carbon steel (typical cutting speed and feed were respectively 150 m/min. and 0.25 mm/rev.) under the above conditions.

Cutting condition C:
Work material: a round bar according to JIS SKD61 (HRC 60)
Cutting speed: 110 m/min
Depth of cut: 0.2 mm
Feed: 0.28 mm/rev
Cutting time: 3 minutes A high-speed cutting work test of high hardness steel (typical cutting speed and feed were respectively 70 m/min. and 0.1 mm/rev.) under the above conditions.

The measurement results are shown in Table 5.

TABLE 1

| | Type | Mixing composition (mass %) | | | |
|---|---|---|---|---|---|
| | | Co | VC | $Cr_3C_2$ | WC |
| Tool body | A-1 | 12 | — | 1 | Remainder |
| | A-2 | 6 | 1 | — | Remainder |
| | A-3 | 10 | — | 0.5 | Remainder |

TABLE 2

| | Type | Mixing composition (mass %) | | | | | | |
|---|---|---|---|---|---|---|---|---|
| | | Co | Ni | ZrC | TaC | NbC | $Mo_2C$ | WC | TiCN |
| Tool body | B-1 | 12 | 5 | — | 10 | — | 10 | 16 | Remainder |
| | B-2 | 9 | 5 | — | 11 | 2 | — | — | Remainder |
| | B-3 | 10 | 4 | 1 | 8 | — | 10 | 10 | Remainder |

TABLE 3

| | | | Hard coating layer | | | | | | | |
|---|---|---|---|---|---|---|---|---|---|---|
| | | | A layer | | B layer | | Relationship between x and y of A layer and B layer | | | |
| | | | Composition of | Value of average layer thickness | Composition | Value of average layer thickness | | | | Total |
| Type | | Tool body symbol | A layer (value of a) | x per layer (nm) | of B layer (value of b) | y per layer (nm) | Value of x/y | Value of (x + y) | Number of laminated units | layer thickness (μm) |
| Present invention coated inserts | 1 | A-1 | 0.50 | 80 | 0.90 | 20 | 4.0 | 100 | 38 | 3.80 |
| | 2 | A-2 | 0.74 | 90 | 0.95 | 20 | 4.5 | 110 | 90 | 9.90 |
| | 3 | A-3 | 0.65 | 150 | 0.75 | 40 | 3.8 | 190 | 50 | 9.50 |
| | 4 | A-1 | 0.70 | 200 | 0.75 | 50 | 4.0 | 250 | 40 | 10.0 |
| | 5 | A-2 | 0.50 | 90 | 0.80 | 30 | 3.0 | 120 | 60 | 7.20 |
| | 6 | A-3 | 0.73 | 185 | 0.85 | 55 | 3.4 | 240 | 4 | 0.96 |
| | 7 | B-1 | 0.74 | 85 | 0.90 | 25 | 3.4 | 110 | 60 | 6.60 |

TABLE 3-continued

| | | Hard coating layer | | | | | | | |
|---|---|---|---|---|---|---|---|---|---|
| | | A layer | | B layer | | Relationship between x and y of A layer and B layer | | | Total |
| | | Composition of | Value of average layer thickness | Composition | Value of average layer thickness | | | | |
| Type | Tool body symbol | A layer (value of a) | x per layer (nm) | of B layer (value of b) | y per layer (nm) | Value of x/y | Value of (x + y) | Number of laminated units | layer thickness (μm) |
| | 8 | B-2 | 0.70 | 76 | 0.95 | 24 | 3.2 | 100 | 5 | 0.50 |
| | 9 | B-3 | 0.69 | 185 | 0.90 | 55 | 3.4 | 240 | 15 | 3.60 |
| | 10 | B-1 | 0.68 | 200 | 0.85 | 40 | 5.0 | 240 | 3 | 0.72 |

TABLE 4

| | | Hard coating layer | | | | | | | |
|---|---|---|---|---|---|---|---|---|---|
| | | C layer | | D layer | | Relationship between x and y of C layer and D layer | | | Total layer |
| | | Composition of | Value of average layer thickness | Composition of | Value of average layer thickness | | | | |
| Type | Tool body symbol | C layer (value of a) | x per layer (nm) | D layer (value of b) | y per layer (nm) | Value of x/y | Value of (x + y) | Number of laminated units | thickness (μm) |
| Comparative coated Inserts | 1 | A-1 | 0.60 | 40 | 0.90 | 20 | 2.0 | 60 | 10 | 0.6 |
| | 2 | A-2 | 0.30 | 90 | 0.50 | 20 | 4.5 | 110 | 50 | 5.5 |
| | 3 | A-3 | 0.78 | 120 | 0.95 | 30 | 4.0 | 150 | 40 | 6 |
| | 4 | B-1 | 0.65 | 90 | 0.70 | 20 | 4.5 | 110 | 10 | 1.1 |
| | 5 | B-2 | 0.60 | 150 | 0.85 | 200 | 0.8 | 350 | 30 | 10.5 |

TABLE 5

| | | Flank wear width (mm) | | | | | Flank wear width (mm) | | |
|---|---|---|---|---|---|---|---|---|---|
| Type | | Cutting condition (A) | Cutting condition (B) | Cutting condition (C) | Type | | Cutting condition (A) | Cutting condition (B) | Cutting condition (C) |
| Present invention coated inserts | 1 | 0.21 | 0.23 | 0.23 | Comparative coated inserts | 1 | 4.0* | 4.2* | 3.5* |
| | 2 | 0.21 | 0.22 | 0.25 | | 2 | 4.3* | 4.8* | 3.6* |
| | 3 | 0.20 | 0.24 | 0.28 | | 3 | 4.6* | 4.5* | 3.7* |
| | 4 | 0.18 | 0.26 | 0.27 | | 4 | 4.5* | 4.3* | 3.8* |
| | 5 | 0.22 | 0.23 | 0.26 | | 5 | 4.1* | 4.3* | 3.7* |
| | 6 | 0.19 | 0.24 | 0.23 | | | | | |
| | 7 | 0.18 | 0.25 | 0.22 | | | | | |
| | 8 | 0.22 | 0.25 | 0.27 | | | | | |
| | 9 | 0.20 | 0.23 | 0.24 | | | | | |
| | 10 | 0.20 | 0.26 | 0.28 | | | | | |

Mark * in boxes of comparative coated inserts indicates a cutting time (min) until the end of a service life caused by abnormal damage to a cutting edge portion.

Example 2

As in Example 1, raw material powders including a WC powder, a VC powder, a $Cr_3C_2$ powder, and a Co powder each having an average grain size of 1 to 3 μm were mixed in mixing compositions shown in Table 1, were wet-mixed by a ball mill for 72 hours, and were dried. Thereafter, the resultant was press-formed into a compact at a pressure of 100 MPa, and the compact was sintered in a vacuum at 6 Pa under the condition that the compact was held at a temperature of 1400° C. for one hour, thereby forming a round bar sintered body for forming a tool body having a diameter of 13 mm. Furthermore, from the round bar sintered body, by performing grinding, each of the tool bodies (end mills) A-1 to A-3 made of WC-based cemented carbide having a four-edge square shape with a helix angle of 30 degrees in dimensions of 10 mm×22 mm as the diameter×the length of the cutting edge portion were produced.

Next, the surfaces of the tool bodies (end mills) A-1 to A-3 were subjected to ultrasonic cleaning in acetone and were dried. In this state, the tool bodies A-1 to A-3 were loaded into the same arc ion plating apparatus illustrated in FIG. 1 and hard coating layers having an alternately laminated structure of A layers and B layers with target compositions and target layer thicknesses shown in Table 6 were deposited under the same conditions as in Example 1. Accordingly, each of present invention surface-coated cemented carbide end mills (hereinafter, referred to as present invention coated end mills) 1 to 6 as present invention coated tools were produced.

In addition, for the purpose of comparison, the surfaces of the tool bodies (end mills) A-1 to A-3 were subjected to ultrasonic cleaning in acetone and were dried. In this state, the tool bodies A-1 to A-3 were loaded into the same arc ion plating apparatus illustrated in FIG. 1 and hard coating layers having alternately laminated layers with target compositions and target layer thicknesses shown in Table 7 were deposited in the same process as in Example 1. Accordingly, each of surface-coated cemented carbide end mills (hereinafter, referred to as comparative coated end mills) 1 to 5 as comparative coated tools were produced.

Next, regarding the present invention coated end mills 1 to 6 and the comparative coated end mills 1 to 5, the composition of each of the layers exhibiting the alternately laminated structures of the hard coating layers was measured by performing energy-dispersive X-ray spectroscopy on the longitudinal section of the hard coating layers using the transmission electron microscope, and all of the results showed substantially the same compositions as the target compositions.

In addition, the average layer thickness of each of the layers exhibiting the alternately laminated structures of the hard coating layers was measured in a section using the transmission electron microscope, and all of the results showed substantially the same average values (average value of 5 points) as the target layer thicknesses.

The measurement values are shown in Tables 6 and 7.

Next, regarding the present invention coated end mills 1 to 6 and comparative coated end mills 1 to 5, Work material-a plate material of JIS SCM440 (HB 330) having planar dimensions of 100 mm×250 mm and a thickness of 50 mm Cutting speed: 240 m/min.
Groove depth (depth of cut): 15 mm
Table feed: 820 mm/min.

Under the above conditions (cutting condition D), a wet high-speed groove cutting work test (typical cutting speed and table feed were respectively 190 m/min. and 650 mm/min.) of chromium-molybdenum steel was conducted, and the cutting groove length until the flank wear width of the outer circumferential edge of the cutting edge portion had reached 0.1 mm, which is regarded as a measure of the service life, was measured.

The measurement results are shown in Tables 6 and 7, respectively.

TABLE 6

| | | | A layer | | B layer | | Relationship between x and y of A layer and B layer | | | | Cutting test results |
|---|---|---|---|---|---|---|---|---|---|---|---|
| Type | | Tool body symbol | Composition of A layer (value of a) | Value of average layer thickness x per layer (nm) | Composition of B layer (value of b) | Value of average layer thickness y per layer (nm) | Value of x/y | Value of (x + y) | Number of laminated units | Total layer thickness (μm) | Cutting groove length (m) |
| Present Invention coated end mills | 1 | A-1 | 0.65 | 80 | 0.95 | 20 | 4.0 | 100 | 5 | 0.5 | 120 |
| | 2 | A-2 | 0.50 | 100 | 0.95 | 20 | 5.0 | 120 | 50 | 6.0 | 130 |
| | 3 | A-3 | 0.74 | 140 | 0.75 | 40 | 3.5 | 180 | 40 | 7.2 | 125 |
| | 4 | A-1 | 0.55 | 200 | 0.90 | 50 | 4.0 | 250 | 40 | 10.0 | 120 |
| | 5 | A-2 | 0.50 | 99 | 0.80 | 33 | 3.0 | 132 | 25 | 3.3 | 135 |
| | 6 | A-3 | 0.68 | 90 | 0.85 | 30 | 3.0 | 120 | 50 | 6.0 | 135 |

TABLE 7

| | | | C layer | | D layer | | Relationship between x and y of C layer and D layer | | | | Cutting test results |
|---|---|---|---|---|---|---|---|---|---|---|---|
| Type | | Tool body symbol | Composition of C layer (value of a) | Value of average layer thickness x per layer (nm) | Composition of D layer (value of b) | Value of average layer thickness y per layer (nm) | Value of x/y | Value of (x + y) | Number of laminated units | Total layer thickness (μm) | Cutting groove length (m) |
| Comparative coated end mills | 1 | A-1 | 0.55 | 20 | 0.90 | 40 | 0.5 | 60 | 10 | 0.6 | 41 |
| | 2 | A-2 | 0.80 | 80 | 0.75 | 20 | 4.0 | 100 | 50 | 5.0 | 46 |
| | 3 | A-3 | 0.78 | 90 | 0.70 | 30 | 3.0 | 120 | 80 | 9.6 | 45 |
| | 4 | A-1 | 0.50 | 90 | 0.98 | 20 | 4.5 | 110 | 50 | 5.5 | 48 |
| | 5 | A-2 | 0.50 | 150 | 0.85 | 40 | 3.8 | 190 | 60 | 11.4 | 46 |

From the results shown in Tables 5 to 7, in the present invention coated tools, on each of the surfaces of the tool bodies, the hard coating layer having an alternately laminated structure of A layers and B layers with a predetermined composition and a layer thickness was formed, and thus the hard coating layer has excellent heat resistance and high hardness. Accordingly, during high-speed cutting work of carbon steel, alloy steel, high hardness steel, and the like, excellent wear resistance is exhibited for a long-term use without the occurrence of abnormal damage such as chipping, fracturing, and peeling.

Contrary to this, in the comparative coated tools in which any one of the layers constituting the hard coating layers deviated from the composition, layer thickness, and the like specified in the present invention, it was apparent that the wear resistance was insufficient, and the service life was reached within a relatively short period of time.

INDUSTRIAL APPLICABILITY

As described above, the coated tools of the present invention exhibit excellent wear resistance and excellent cutting performance over a long period of time not only during a high-speed cutting work of carbon steel, alloy steel, high hardness steel, and the like, but also during the cutting work of a general work material. Therefore, the coated tools of the present invention can satisfactorily cope with the automation of cutting work apparatuses, power saving and energy saving during the cutting work, and a further reduction in costs.

The invention claimed is:

1. A surface-coated cutting tool in which a hard coating layer having a total layer thickness of 0.5 to 10 μm is deposited on a surface of a tool body made of tungsten carbide cemented carbide or titanium carbonitride cermet, wherein
   (a) the hard coating layer has an alternately laminated structure of A layers and B layers,
   (b) in a case where the A layer is expressed by a composition formula: $(Al_aTi_{1-a})N$ (here, a is in atomic ratio), the A layer satisfies $0.50 \leq a < 0.75$,
   (c) in a case where the B layer is expressed by a composition formula: $(Al_bTi_{1-b})N$ (here, b is in atomic ratio), the B layer satisfies $0.75 \leq b \leq 0.95$, and
   (d) when a layer thickness per layer of the A layers is represented by x (nm) and a layer thickness per layer of the B layers is represented by y (nm), $5y \geq x \geq 3y$ and $250 \text{ (nm)} \geq x+y \geq 100 \text{ (nm)}$ are satisfied.

* * * * *